US008495478B2

(12) United States Patent
Liu et al.

(10) Patent No.: US 8,495,478 B2
(45) Date of Patent: Jul. 23, 2013

(54) FRAME BOUNDARY DETECTION AND DECODING

(75) Inventors: Yang Liu, Shanghai (CH); Bo Fan, Beijing (CH); Yi Fan Lin, Shanghai (CH); Yufei Li, Shanghai (CH)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 13/108,081

(22) Filed: May 16, 2011

(65) Prior Publication Data

US 2011/0296282 A1    Dec. 1, 2011

(30) Foreign Application Priority Data

May 31, 2010    (CN) .......................... 2010 1 0192374

(51) Int. Cl.
*H03M 13/03*    (2006.01)

(52) U.S. Cl.
USPC ............................ 714/785; 714/781; 714/786

(58) Field of Classification Search
USPC ................. 714/785, 746, 752, 758, 781–784, 714/786, 793, 52, 51, 48
See application file for complete search history.

(56) References Cited

U.S. PATENT DOCUMENTS

| | | | | |
|---|---|---|---|---|
| 5,396,239 A | * | 3/1995 | McMahon et al. | 341/58 |
| 6,990,624 B2 | * | 1/2006 | Dohmen et al. | 714/785 |
| 7,978,972 B2 | * | 7/2011 | Ohira et al. | 398/25 |

* cited by examiner

*Primary Examiner* — Christine Tu
(74) *Attorney, Agent, or Firm* — J. B. Kraft; Steven L. Bennett

(57) ABSTRACT

Disclosed are a method and apparatus for detecting frame boundary for a data stream received at an Ethernet FEC layer, as well as a decoding method and system for the same. The apparatus for detecting frame boundary may comprise: a buffer for buffering data in a data stream, a length of the data in the buffer being greater than one frame; a syndrome generator for calculating a current syndrome based on a first data item, a second data item, and an intermediate calculation result of a previous syndrome, wherein the first data item is the last bit in a current candidate frame, and the second data item is a bit preceding the current candidate frame; and a comparator for using the current syndrome to check whether the bit preceding the current candidate frame is a frame boundary of an Ethernet FEC layer. The apparatus for detecting frame boundary can improve the speed of frame boundary detection.

16 Claims, 7 Drawing Sheets

FRAME BOUNDARY DETECTION AND DECODING

TECHNICAL FIELD

Embodiments of the present invention relate to the field of data communication and, more specifically, to a method and apparatus for detecting the frame boundary for a data stream received at an Ethernet Forward Error Correction (FEC) layer, and a decoding method and system for the same.

DESCRIPTION OF THE RELATED ART

IEEE Standard 802.3-2008, clause 74 and IEEEP 802.3 D1.2 define a FEC sub-layer used in a 10 G Ethernet BASE-R physical layer. This FEC sub-layer standard lowers the bit error rate (BER) from $10^{-7}$ to $10^{-12}$ and is also suitable for 40 G/100 G Ethernet applications.

To be compatible with different Ethernet application layers, protocols provide that the FEC layer compresses an original frame header to reserve space for loading FEC check bits, so it is ensured that this layer keeps the same frame length (IEEE Standard 802.3-2008, clause 74 defines a frame length of 2112 bits) as other application layers. However, such a processing method makes it quite difficult to identify a frame boundary between respective frames at the receiver side and a large quantity of time is taken for synchronization with frames at the transmitter side in order to find the correct frame boundary.

Therefore, there is a need for a method capable of fast frame boundary detection and capable of fast FEC decoding for a data stream received at the Ethernet FEC layer.

SUMMARY OF THE INVENTION

In view of the above problems, this specification provides a method and apparatus for detecting the frame boundary for a data stream received at an Ethernet FEC layer, as well as a decoding method and system for the same.

In one embodiment of the present invention, there is provided a method of detecting the frame boundary for a data stream received at an Ethernet FEC layer. The method of detecting the frame boundary may comprise: calculating a current syndrome based on a first data item, a second data item and an intermediate calculation result of a previous syndrome wherein the first data item is the last bit in a current candidate frame and the second data item is a bit preceding the current candidate frame; and using the current syndrome to check whether the bit preceding the current candidate frame is a frame boundary of an Ethernet FEC layer.

In another embodiment of the present invention, there is provided an apparatus for detecting the frame boundary for a data stream received at an Ethernet FEC layer. The apparatus for detecting frame boundary may comprise: a buffer for buffering data in a data stream, a length of the data in the buffer being greater than one frame; a syndrome generator for calculating a current syndrome based on a first data item, a second data item and an intermediate calculation result of a previous syndrome wherein the first data item is the last bit in a current candidate frame and the second data item is a bit preceding the current candidate frame; and a comparator for using the current syndrome to check whether the bit preceding the current candidate frame is a frame boundary of the Ethernet FEC layer.

In a further embodiment of the present invention, there is provided a decoding method for a data stream received at an Ethernet FEC layer. The decoding method may comprise: detecting a frame boundary of the data stream by using a frame boundary detection method according to the above-described embodiment of the present invention and outputting a current syndrome; determining an error in a current frame based on the current syndrome and a check code in a current candidate frame; descrambling the current candidate frame; and performing forward error correction on the descrambled frame based on the determined error.

In a further embodiment of the present invention, there is provided a decoding system for a data stream received at an Ethernet FEC layer. The decoding system may comprise: an apparatus for detecting the frame boundary according to the above-described embodiment of the present invention for detecting a frame boundary of the data stream and outputting a current syndrome; an error diagnosing unit for determining an error in a current frame based on the current syndrome and a check code in the current frame; a descrambler for descrambling the current frame; and an error corrector for performing based on the error determined by the error diagnosing unit, forward error correction on the frame that is descrambled by the descrambler.

According to the methods, apparatus and system in various embodiments of the present invention, it is possible to quickly determine a frame boundary and, thus, the frame boundary detection is sped up and the frame synchronization is improved.

Other features and advantages of the present invention will become more apparent from the following description of preferred embodiments that illustrate principles of the present invention when taken in conjunction with the figures.

BRIEF DESCRIPTION OF THE DRAWINGS

As the present invention is comprehended more thoroughly, other objects and effects of the present invention will become more apparent and easier to understand by means of the following description with reference to the accompanying drawings, wherein.

Like numerals represent the same, similar or corresponding features or functions throughout the figures.

DETAILED DESCRIPTION OF THE PREFERRED EMBODIMENT

A more detailed description will be presented below regarding embodiments of the present invention with reference to the figures. It will be understood that the figures and embodiments, as covered in this specification, are merely for illustration rather than limiting the protection or scope of the present invention.

In one embodiment of the present invention, a current syndrome is calculated based on a first data item, a second data item and an intermediate calculation result of a previous syndrome. Here, the first data item is the last bit in a current candidate frame and the second data item is a bit preceding the current candidate frame. Then, it is checked by using the current syndrome whether the bit preceding the current candidate frame is a frame boundary of an Ethernet FEC layer.

In the following embodiments of the present invention, one frame of data comprises 2112 bits, among which 2080 bits are payloads and 32 bits are check codes. It will be understood that the methods, apparatus and system in embodiments of the present invention are not limited to these values but may be used in a frame of any length.

Figure 1:
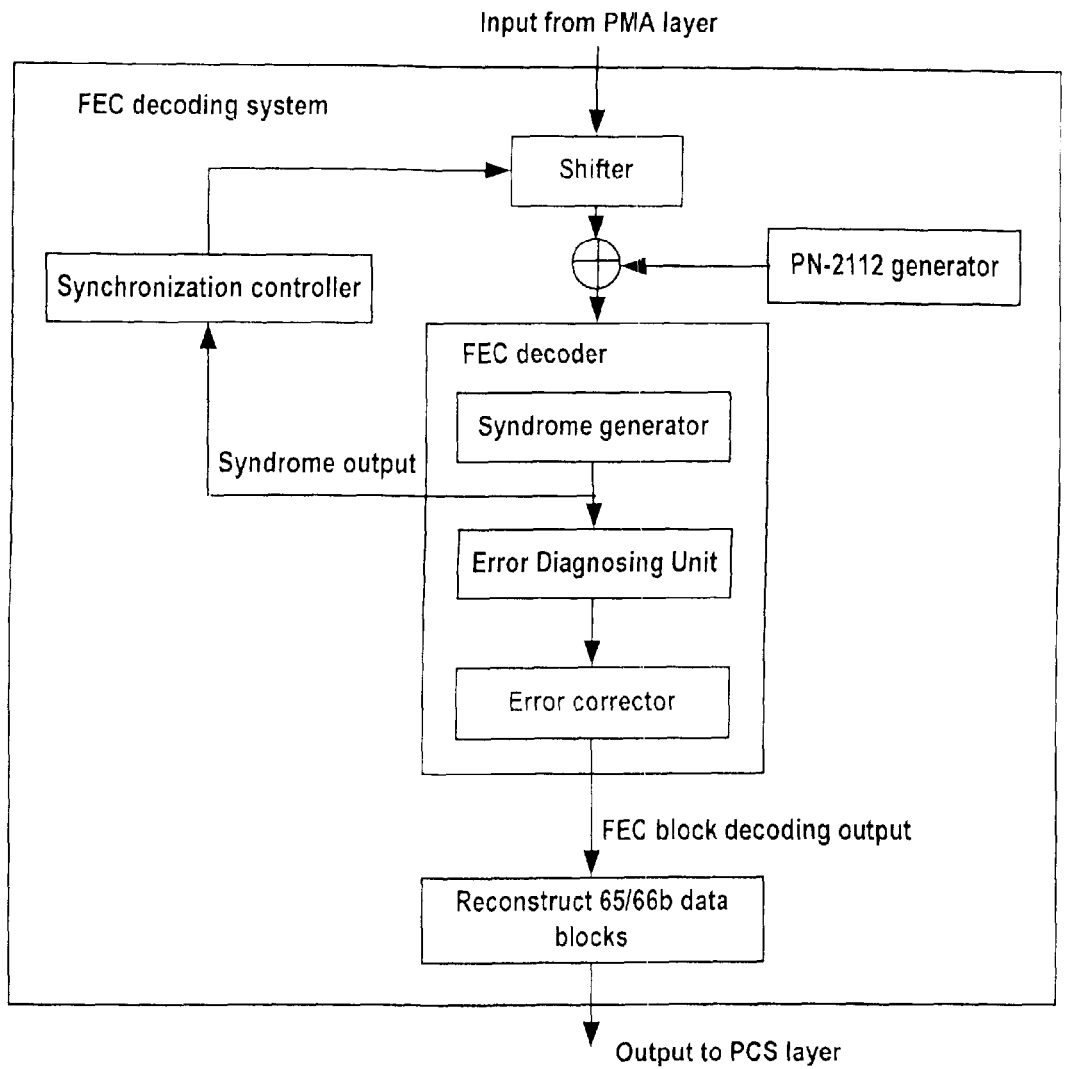
FIG. 1 is a block diagram of a decoding system for a data stream received at an Ethernet FEC layer according to a technical solution.

FIG. 1 is a block diagram of a decoding system for a data stream received at an Ethernet FEC layer according to a technical solution. Specifically, FIG. 1 illustrates a structural view of an FEC decoding system that is defined in IEEE 802.3-2008, clause 74. The FEC decoding system receives an input from a PMA (Physical Medium Attachment) layer and outputs the result of processing to a PCS (Physical Coding Sublayer). The FEC decoding system comprises five (5) modules. A shifter is for shifting data received from the PMA layer. A PN-2112 generator is for generating a PN2112 sequence that will be used for a XOR operation with the data shifted by the shifter, so as to descramble the received data. The data shifted by the shifter is inputted into a FEC decoder subsequent to the XOR operation with the data generated by the PN-2112 generator. The FEC decoder performs forward correction on the inputted data and outputs the corrected data. The outputted data passes through a reconstruction 64/66 data block. This module can restore a frame header for the FEC decoded data, i.e. restoring the 2080 bits of payloads in each FEC frame of data to 32 PCS frames, each of which is 66 bits long. An output of this module then enters the PCS layer. Further, the FEC decoder outputs a generated syndrome to a synchronization controller for controlling the FEC frame synchronization. An output of the synchronization controller is delivered to the shifter for shift control of the shifter.

The FEC decoder itself comprises a syndrome generator, an error diagnosing unit and an error corrector. It is used for forward error correction and, because of the particular feature of relevant protocols of the present invention, it is further used for synchronization with frames at the transmitter side.

The synchronization procedure involved in the circuit structure of FIG. 1 comprises the following steps:

a) testing an assumptive frame boundary position;
a1) assuming a frame boundary position by the shifter and starting from this assumptive frame boundary position, performing descrambling computation on the received data by using the PN-2112 generator;
a2) performing a FEC check on one frame of data with a start position of the assumptive frame boundary, by using the syndrome generator;
if the check does not match (the received check code does not match the computed check code), the synchronization controller then controls the shifter to shift the assumptive frame boundary position by one bit position, and step a) is tried again;
b) for an assumptive frame boundary, the synchronization controller will validate, according to a result outputted by the syndrome generator, that FEC checks for n consecutive frames are correct;
b1) if a FEC check for any one of n consecutive frames fails, then the synchronization controller will control the shifter to shift the assumptive frame boundary position by one bit position, and the entire frame synchronization procedure starts again;
b2) if the synchronization controller detects that FEC checks for n consecutively received frames are all correct, then the procedure proceeds to step c);
c) frame synchronization is established;
d) if the synchronization controller detects that FEC checks for m consecutively received data frames all fail, then it is deemed that frame synchronization is desynchronized and the entire frame synchronization procedure starts again.

For a 2112-bit frame length, the foregoing steps are repeated at most 2111 times to traverse all possible 2112 positions for finding a correct frame boundary position. In the foregoing description, typically: m=8, n=4.

Figure 2:
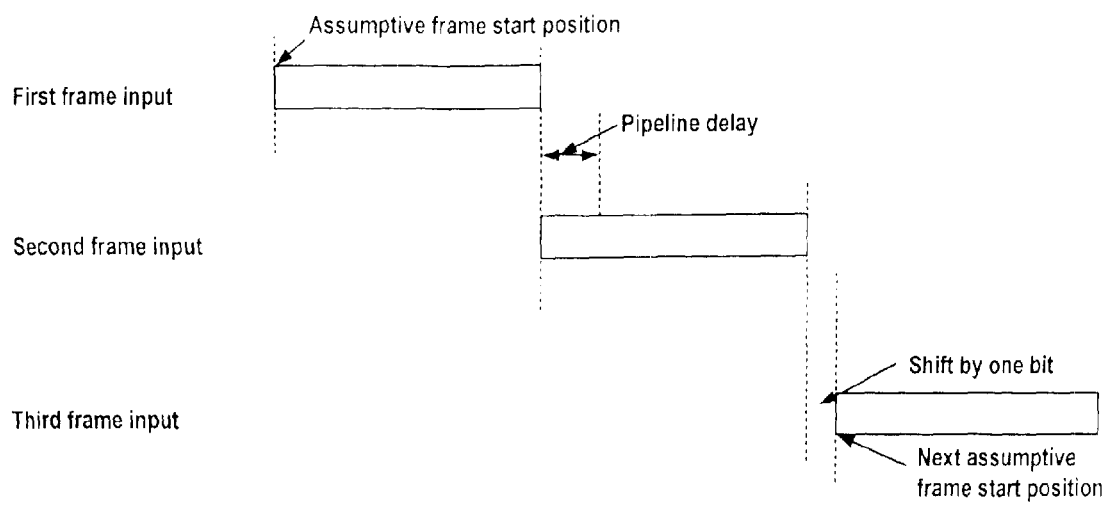
FIG. 2 illustrates a schematic view of frame synchronization performed by the decoding system as illustrated in FIG. 1.

FIG. 2 illustrates a schematic view of frame synchronization implemented by the decoding system as illustrated in FIG. 1. According to FIG. 2, at the beginning frame synchronization logic does not know a correct start position and, hence, has to assume a frame start position in a frame so as to check this frame. When the last bit in a first frame enters the frame synchronization logic, the frame synchronization logic cannot immediately generate a check result for this frame because there is a delay caused by the pipeline-based structural design in the hardware implementation. The delay is caused by some functional logic, such as descrambles, and is unavoidable. So after the pipeline delay, if the frame synchronization logic detects that there is an error in the first frame boundary position, the frame synchronization logic has to shift a subsequent assumptive frame boundary position by one (1) bit as a next assumptive frame boundary. At this point, because of the pipeline delay as illustrated in FIG. 2, it is too late to shift by one (1) bit from a frame boundary start position of a second frame and check the second frame. Hence, the frame synchronization logic has to discard the entire second frame. Only if a third frame of data comes, the frame synchronization logic will shift by one (1) bit based on a frame boundary of the third frame and repeat the check operation on the third frame as on the first frame.

As such, in the worst case, the frame synchronization logic needs to check 2112 frames, discard 2111 frames and shift 2111 times of one (1) bit, which will take (2112+2111)*2112+2111=8,921,087 BT (bit time) to get the correct frame boundary (correct start position of the frame). This frame synchronization time is much longer than other high-speed interfaces (SATA2.0 about 600,000 BT and PCIE2.0 about 500,000 BT) that work at a close rate.

In the solutions of FIGS. 1 and 2, because of the existence of a pipeline structure in the hardware, almost half of the frames have to be discarded if a method of shifting by one (1) bit position at a time is used for detecting a frame boundary. As a result, the detection of the frame boundary is prolonged, and the frame synchronization speed is slowed down.

Embodiments of the present invention improve a method for frame boundary detection. Specifically, the syndrome for the current candidate frame, that is, the current syndrome, is not generated from input data but from the intermediate calculation result of the syndrome (previous syndrome) for the previous candidate frame. Hence, the frame synchronization procedure is accelerated.

For the convenience of description, suppose only one (1) bit is inputted in a series in each clock cycle. In a practical implementation of the circuit, however, parallel input and processing of any bit may be supported by extending the circuit structure.

Figure 3:
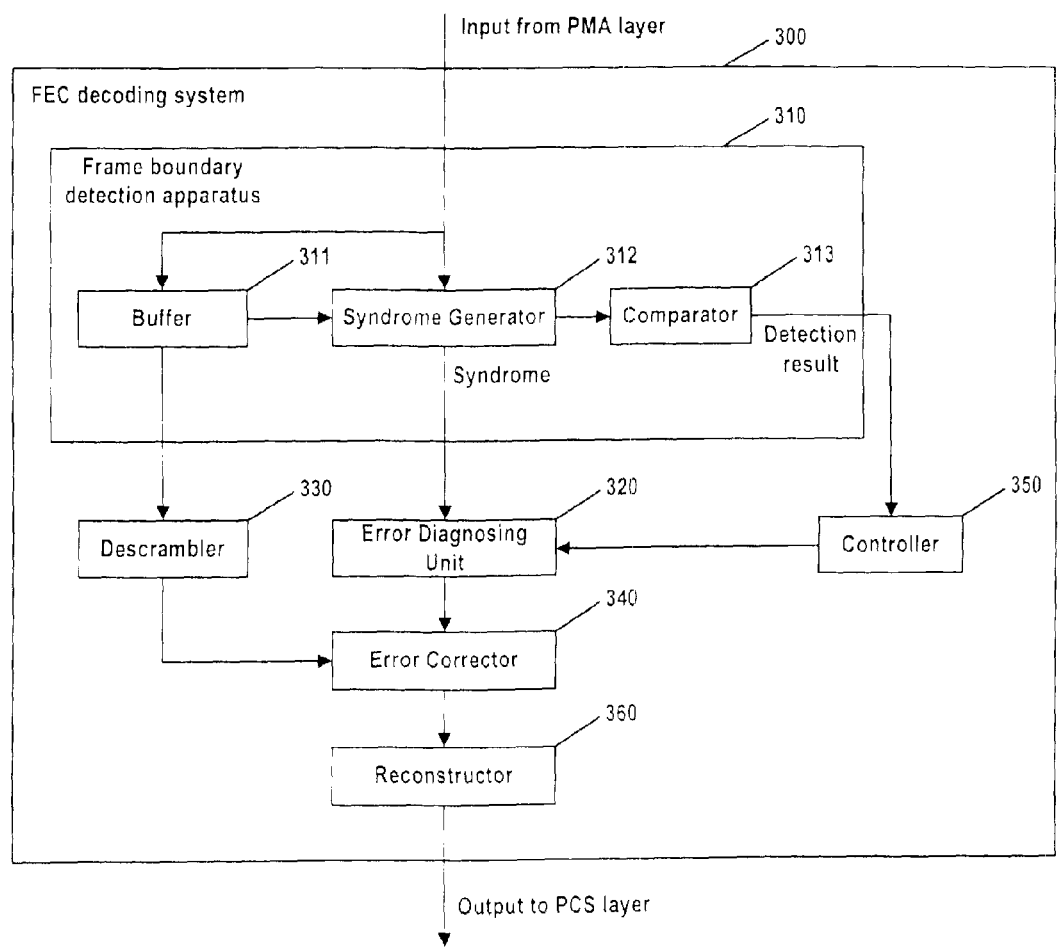
FIG. 3 is a schematic block diagram of a decoding system for a data stream received at an Ethernet FEC layer according to one embodiment of the present invention.

FIG. 3 is a schematic block diagram of a decoding system 300 for a data stream received at an Ethernet FEC layer according to one (1) embodiment of the present invention.

The FEC decoding system 300 comprises: an apparatus for detecting frame boundary 310, an error diagnosing unit 320, a descrambler 330 and an error corrector 340. The FEC decoding system 300 may further comprise a controller 350 and a reconstructor 360.

The apparatus for detecting frame boundary 310 detects a frame boundary of the data stream and outputs a current syndrome. The error diagnosing unit 320 determines an error in a current frame based on the current syndrome and a check code of the current frame. The descrambler 330 descrambles the current frame. The error corrector 340 performs forward error correction on the frame descrambled by the descrambler based on the error determined by the error diagnosing unit. The controller 350 determines whether to perform frame boundary detection or forward error correction based on a result of frame boundary detection from the apparatus for detecting frame boundary. The reconstructor 360 is for reconstructing data on which forward error correction has been performed into a format adaptive for the Physical Coding Sub-layer.

In the FEC decoding system 300, according to one embodiment of the present invention, the apparatus for detecting frame boundary 310 may comprise: a buffer 311 for buffering data in the data stream, a length of data in the buffer being greater than one (1) frame; a syndrome generator 312 for calculating a current syndrome based on a first data item, a second data item and an intermediate calculation result of a previous syndrome wherein the first data item is the last bit in a current candidate frame and the second data item is a bit preceding the current candidate frame; and a comparator 313 for using the current syndrome to check whether the bit preceding the current candidate frame is a frame boundary of the Ethernet FEC layer.

In one embodiment, the decoding procedure of the FEC decoding system 300 is described below.

First of all, the apparatus for detecting frame boundary 310 detects, by using the above-described method of detecting the frame boundary, a frame boundary of a received data stream that is inputted from the PMA layer and outputs a syndrome associated with a current frame; the syndrome being called a current syndrome. When the frame boundary is detected, the controller 350 notifies the error diagnosing unit 320 to diagnose an error in the current frame. Then, the error diagnosing unit 320 determines the error in the current frame based on the current syndrome and the check code of the current frame, wherein the check code of the current frame may be obtained according to the frame format of an Ethernet FEC layer. Subsequently, the current frame is descrambled by using, for example, the descrambling approach as adopted in the technical solution illustrated in FIG. 1. That is, a XOR operation is performed on data in the current frame from the buffer 311 by using a PN2112 sequence generated by the PN-2112 generator, whereby the current frame is descrambled. Afterwards, the error corrector 340 performs forward error correction on the descrambled frame based on the error determined by the error diagnosing unit 320. Error-corrected data is input into the reconstructor 360. The reconstructor 360 recontructs the data on which forward error correction has been performed into a format adaptive for the PCS layer, wherein the reconstructor 360 restores the 2080 bits of payload among the 2112 bits of the current frame to 32 PCS frames, each of which is 66 bits long. Finally, an output of this module is delivered to the PCS layer.

Figure 4:
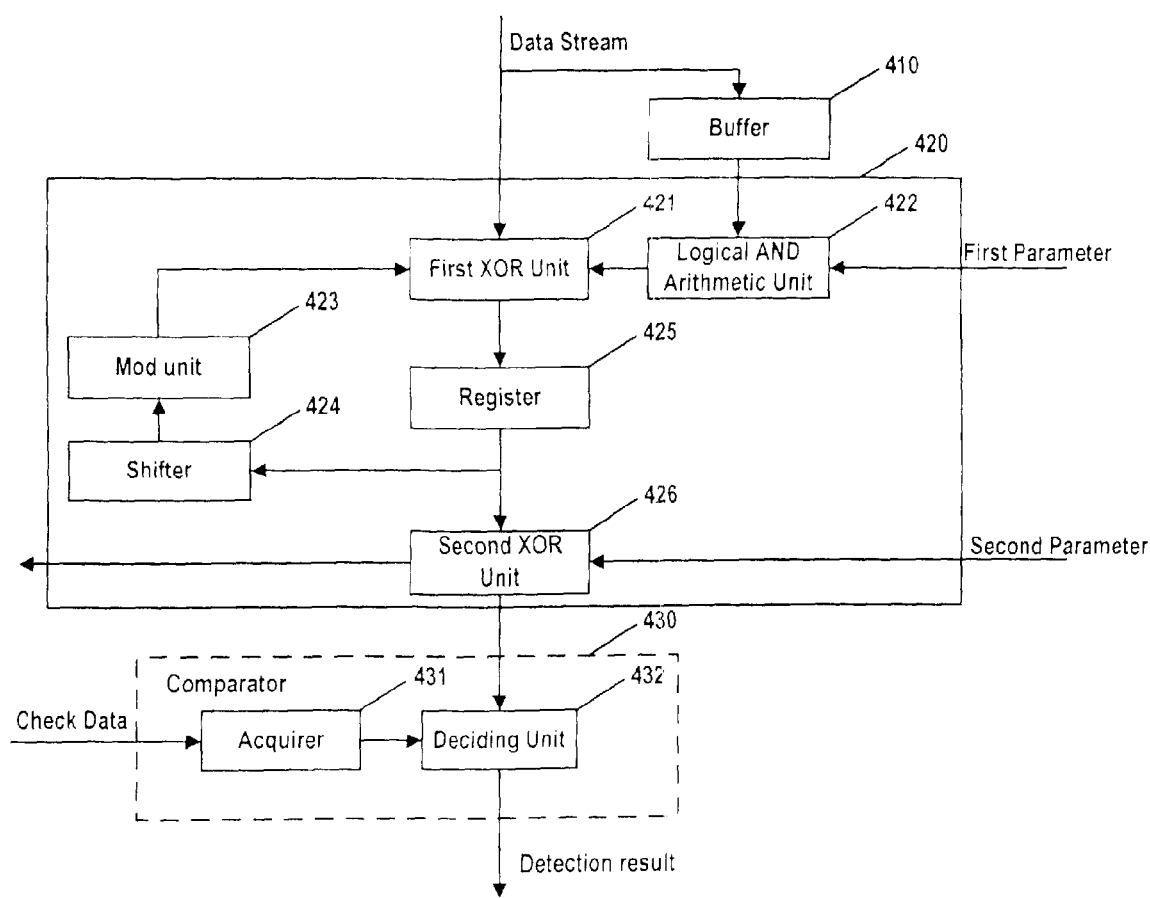
FIG. 4 is a schematic block diagram of an apparatus for detecting frame boundary for a data stream received at an Ethernet FEC layer according to one embodiment of the present invention.

FIG. 4 is a block diagram of an apparatus for detecting the frame boundary for a data stream received at an Ethernet FEC layer according to one embodiment of the present invention. The apparatus for detecting frame boundary illustrated in FIG. 4 mainly comprises three components: a buffer 410, a syndrome generator 420 and a comparator 430.

Figure 5:
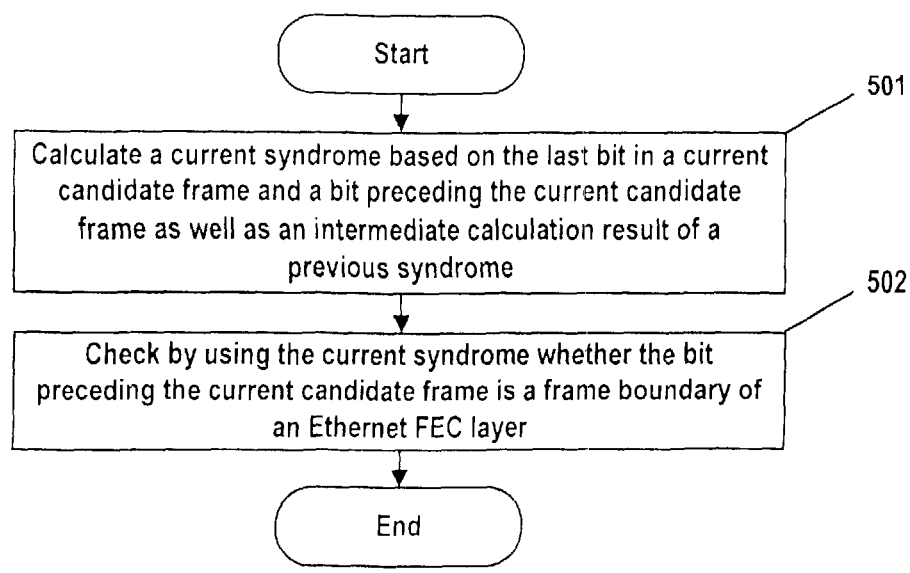
FIG. 5 is a schematic flowchart of a method of detecting the frame boundary for a data stream received at an Ethernet FEC layer according to one embodiment of the present invention.

Generally speaking, the apparatus for detecting the frame boundary illustrated in FIG. 4 can perform a method of detecting the frame boundary for a data stream received at an Ethernet FEC layer according to one embodiment of the present invention, as illustrated in FIG. 5. In step 501, the syndrome generator 420 may calculate a current syndrome based on a first data item, a second data item and an intermediate calculation result of a previous syndrome wherein the first data item is the last bit in a current candidate frame and the second data item is a bit preceding the current candidate frame and may be obtained from the buffer 410. In step 502, the comparator 430 may check by using the current syndrome whether the bit preceding the current candidate frame is a frame boundary of an Ethernet FEC layer. Specifically, a structure of the apparatus for detecting the frame boundary illustrated in FIG. 4 is described below.

The buffer 410 is for buffering data in the data stream. A length of data that the buffer 410 may store is greater than one (1) frame. The buffer 410 may be, for example, a FIFO memory.

The syndrome generator 420 comprises: a first XOR unit 421, a logical AND arithmetic unit 422, a mod unit 423, a shifter 424, a register 425 and a second XOR unit 426. The register 425 may store an intermediate calculation result of a syndrome. The shifter 424 may shift a data item. The mod unit 423 may perform a modulus operation on a data item. The logical AND arithmetic unit 422 may perform a logical AND operation. The first XOR unit 421 may perform a XOR operation on three (3) data items. The second XOR unit 426 may perform an XOR operation on two (2) data items.

The first XOR unit 421 receives a first data item as a first input for calculating a current syndrome. The logical AND arithmetic unit 422 receives a second data item and performs a logical AND operation on the second data item and a first parameter, thereby obtaining a second input for calculating the current syndrome. The shifter 424 shifts a first output for calculating a previous syndrome that is stored in the register 425, by one (1) bit leftward. The mod unit 423 performs a modulus operation on the shifted data to obtain a third input for calculating the current syndrome. The first XOR unit 421 performs a XOR operation on the first input, the second input and the third input for calculating the current syndrome to obtain a first output for calculating the current syndrome and store the first output in the register 425. The second XOR unit 426 performs a logical AND operation on a second parameter and the first output for calculating the current syndrome to obtain the current syndrome.

The comparator 430 may comprise an acquirer 431 and a deciding unit 432. The acquirer 431 may obtain data at a check code position in the current candidate frame according to the framer format of an Ethernet FEC layer. The deciding unit 432 may determine that the bit preceding the current candidate frame is a frame boundary of an Ethernet FEC layer in response to the current syndrome matching the data at the check code position.

Figure 6:
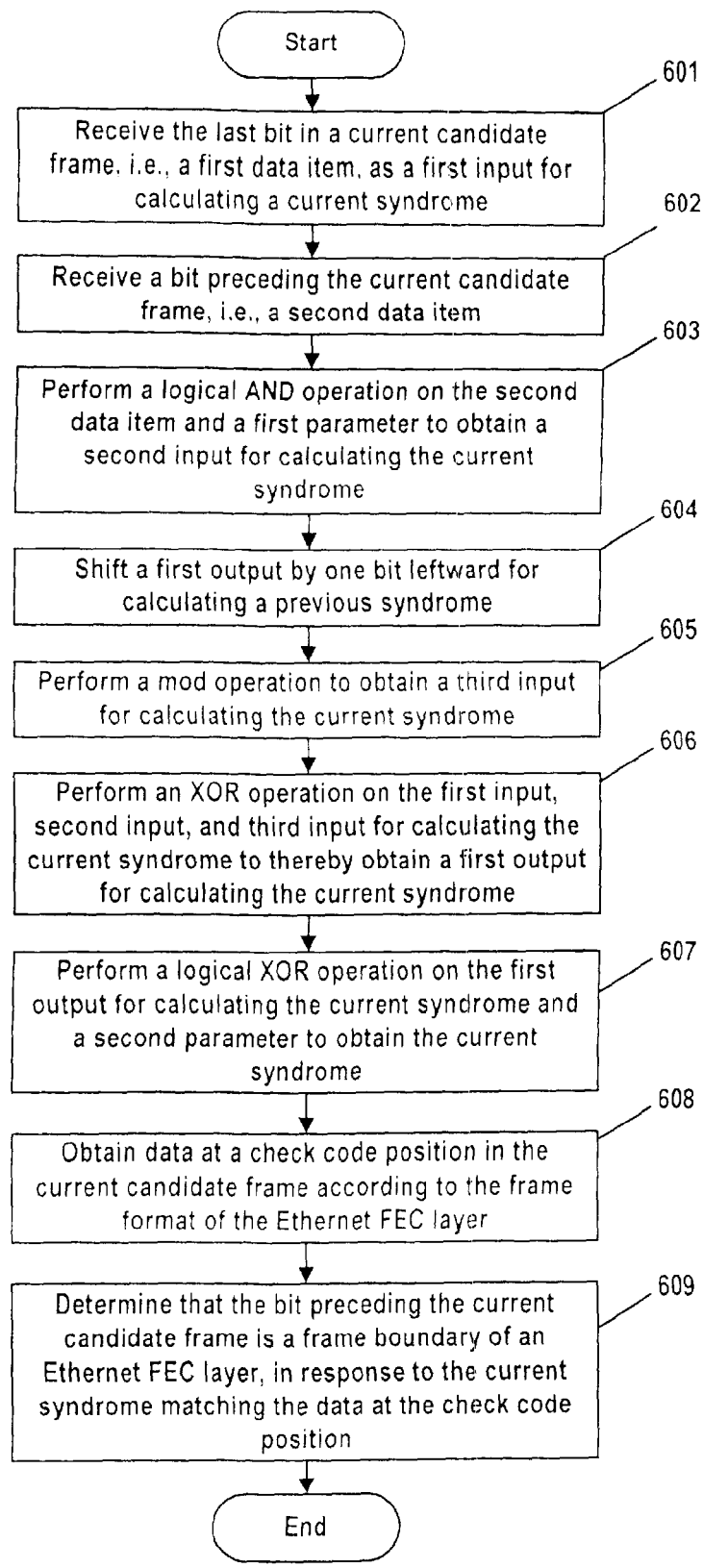
FIG. 6 is a schematic flowchart of a method of detecting the frame boundary for a data stream received at an Ethernet FEC layer according to another embodiment of the present invention.

Referring to FIG. 6 describes how the apparatus for detecting the frame boundary in FIG. 4 detects a frame boundary by using a method of detecting the frame boundary according to one embodiment of the present invention.

FIG. 6 is a flowchart of a method of detecting the frame boundary for a data stream received at an Ethernet FEC layer according to another embodiment of the present invention.

In one embodiment, a syndrome is obtained according to equation (1):

$$\text{Syndrome}_{(n-1):(n+FL)} = r(x)_{(n+FL)} \oplus [r(x)_n \& \text{MOD2}] \oplus [(\text{MODR}_{n::(n+FL-1)} \bullet x) \bmod g(x)] \oplus \text{MOD}PN \quad (1)$$

where

FL is a length of one frame. Because it is assumed in this embodiment to adopt a frame under the IEEE 802.3 Standard, the length of a frame is 2112 bits, i.e. FL=2112.

$\text{Syndrome}_{(n+1):(n+FL)}$ is a syndrome calculated for a current candidate frame, i.e. a current syndrome, whose length is equal to the length of check bits in a frame. Because it is assumed in this embodiment to adopt a frame under the IEEE 802.3 Standard, a length of check bits in a frame is 32 bits, i.e. the length of the syndrome is 32 bits. Those skilled in the art would appreciate that the methods and system of the present invention also apply even when the length of a frame is not equal to 2112 bits or the length of check bits is not equal to 32 bits.

$r(x)_{(n+FL)}$ is a first input for calculating the current syndrome. $r(x)$ represents data received in a data stream from the PMA layer. Assuming a sequential number of bits preceding a current candidate frame is n and a sequential number of the first bit of this current candidate frame is n+1, a sequential number of the last bit of this current candidate frame is n+FL. Hence, $r(x)_{(n+FL)}$ is the last bit of the current candidate frame in the data stream from the PMA layer and is referred to as a first data item for short.

$r(x)_n \& \text{MOD2}$ is a second input for calculating the current syndrome. As described above, $r(x)$ represents data received in a data stream from the PMA layer. Assuming a sequential number of the first bit of a current candidate frame is n+1, $r(x)_n$ represents a bit preceding the current candidate frame, which is referred to as a second data item for short. MOD2 is a first parameter with a length equal to the length of check bits in a frame. The first parameter is a preset and fixed parameter and can be obtained from $\text{MOD2}=(\text{MOD1} \bullet x) \bmod g(x)$ wherein $\text{MOD1}=x^{FL-1} \bmod g(x)$ is also a fixed parameter. In one embodiment of the present invention, MOD2 may be stored in a circuit in hardwired form. The symbol & represents a logical AND operation; for example, if $r(x)_n=0$, then the second input for calculating the current syndrome is 0; if $r(x)_n=1$, then the second input for calculating the current syndrome is MOD2.

$(\text{MODR}_{n::(n+FL-1)} \bullet x) \bmod g(x)$ is a third input for calculating the current syndrome, which means that $\text{MODR}_{n:(n+FL-1)}$ is shifted by one (1) bit leftward (•x represents a one (1) bit, leftward shift) and then is mod with respect to g(x). $\text{MODR}_{n:(n+FL-1)}$ a first output for calculating a previous syndrome, wherein the first output for calculating the previous syndrome is an intermediate calculation result of the previous syndrome. In this embodiment, the first output is obtained through a XOR operation on the first input, second input and third input for calculating the previous syndrome, as shown by equation (2):

$$\text{MODR}_{n:(n+FL-1)} = [(\text{MODR}_{(n-1):(n+FL-2)} \bullet x) \bmod g(x)] \oplus [r(x)_{n-1} \& \text{MOD2}] \oplus r(x)_{(n+FL-1)} \quad (2)$$

The mod processing may use the following polynomial that is determined in section 74.7.4.4.1 of IEEE 802.3:

$$g(x)=x^{32}+x^{23}+x^{21}+x^{11}+x^2+1$$

After the first input, second input and third input for calculating the current syndrome are obtained, these three (3) inputs are subjected to a XOR operation, which results in a first output for calculating the current syndrome. The obtained first output is an intermediate calculation result of the current syndrome, which can be used for calculating a next syndrome. In this way, each time a syndrome is calculated, it is possible to use an intermediate calculation result of a previous syndrome, thereby significantly reducing the amount of calculation and considerably improving the processing speed.

MODPN is a second parameter with a length equal to the length of check bits of a frame. The second parameter is a preset and fixed parameter, and $\text{MODPN}=\text{PN2112} \bmod g(x)$, wherein PN2112 is a pseudo-noise sequence with a length of one (1) frame and can be generated by the PN-2112 generator in the prior art so as to descramble data.

The second parameter MODPN and the first output for calculating the current syndrome $r(x)_{(n+FL)} \oplus [r(x)_n \& \text{MOD2}] \oplus [(\text{MODR}_{n:(n+FL-1)} \bullet x) \bmod g(x)]$ are subjected to a logical AND operation, which results in a current syndrome $\text{Syndrome}_{(n+1):(n+FL)}$.

Now, reference is made to FIG. 6. In step 601, the last bit in the current candidate frame, i.e. the first data item $r(x)_{(n+FL)}$ is received as the first input for calculating the current syndrome. In one embodiment, in the apparatus for detecting the frame boundary, as illustrated in FIG. 4, the first XOR unit 421 receives the last bit of the current candidate frame.

In step 602, the bit preceding the current candidate frame, i.e. the second data item $r(x)_n$ is received.

In step 603, the second data item $r(x)_n$ and the first parameter MOD2 are subjected to a logical AND operation, resulting in the second input $r(x)_n \& \text{MOD2}$ for calculating the current syndrome. In one embodiment, in the apparatus for detecting the frame boundary, as illustrated in FIG. 4, the logical AND arithmetic unit 422 receives the bit $r(x)_n$ preceding the current candidate frame and the first parameter MOD2, performs a logical AND operation on $r(x)_n$ and MOD2 to obtain the second input for calculating the current syndrome and outputs the second input to the first XOR unit 421.

In step 604, the first output $\text{MODR}_{n:(n+FL-1)}$ for calculating the previous syndrome is shifted by one (1) bit leftward, thereby $\text{MODR}_{n:(n+FL-1)} \bullet x$ can be obtained. In one embodiment, in the apparatus for detecting the frame boundary, as illustrated in FIG. 4, $\text{MODR}_{n:(n+FL-1)}$ for calculating the previous syndrome comes from the first XOR unit 421 and is shifted by the shifter 424 by one (1) bit leftward.

In step 605, the result obtained from step 604 is mode with respect to g(x), thereby the third input $(\text{MODR}_{n:(n+FL-1)} \bullet x) \bmod g(x)$ can be obtained for calculating the current syndrome. In one embodiment, in the apparatus for detecting the frame boundary, as illustrated in FIG. 4, the mod unit 423 performs a mod operation on the result shifted by the shifter 424 with respect to g(x), thereby obtaining the third input for calculating the current syndrome and inputting it into the first XOR unit 421.

In step 606, the first input $r(x)_{(n+FL)}$, second input $r(x)_n \& \text{MOD2}$ and third input $(\text{MODR}_{n:(n+FL-1)} \bullet x) \bmod g(x)$ for calculating the current syndrome are subjected to a XOR operation, thereby the first output $r(x)_{(n+FL)} \oplus [r(x)_n \& \text{MOD2}] \oplus [(\text{MODR}_{n:(n+FL-1)} \bullet x) \bmod g(x)]$ can be obtained for calculating the current syndrome.

In one embodiment, in the apparatus for detecting the frame boundary, as illustrated in FIG. 4, the first XOR unit 421 performs a XOR operation on the first input for calculating the current syndrome obtained in step 601, the second input for calculating the current syndrome obtained from the logical AND arithmetic unit 422 in step 603 and the third input for calculating the current syndrome obtained from the mod unit 423 in step 605, thereby obtaining the first output for calculating the current syndrome.

In step 607, a logical XOR operation is performed on the first output for calculating the current syndrome and the second parameter MODPN, thereby the current syndrome) Syndrome$_{(n+1):(n+FL)}$ can be obtained.

In one embodiment, in the apparatus for detecting the frame boundary, as illustrated in FIG. 4, the second XOR unit 426 receives the second parameter, subjects it to a XOR operation with the first output for calculating the current syndrome as obtained in step 606, and finally obtains the syndrome for the current candidate frame, i.e. the current syndrome. After obtaining the current syndrome, the second XOR unit 426 may provide it to the deciding unit in the comparator 430 for frame boundary judgment and the second XOR unit 426 may further provide it to the error diagnosing unit 320, illustrated in FIG. 2, for diagnosing an error in the current frame (because it is determined during error diagnosis that the current candidate frame is a frame of the Ethernet FEC layer, the current candidate frame is called a current frame).

In step 608, data at the check code position in the current candidate frame is obtained according to the frame format of the Ethernet FEC layer. In one embodiment, in the apparatus for detecting the frame boundary, as illustrated in FIG. 4, the acquirer 431 in the comparator 430 performs step 608 to obtain, from the current candidate frame, data that is located at the check code position in the current candidate frame and has the same length as the syndrome. Then the acquirer 431 inputs the data into the deciding unit 432.

In step 609, when the current syndrome Syndrome$_{(n+1):(n+FL)}$ matches the data at the check code position, it is determined that the bit preceding the current candidate frame is a frame boundary of an Ethernet FEC layer. In one embodiment in the apparatus for detecting the frame boundary, as illustrated in FIG. 4, the deciding unit 432 in the comparator 430 receives the obtained data at the check code position in the current candidate frame, receives the current syndrome from the second XOR unit 426 and compares each bit of the received data and current syndrome. In the case of the received data and current syndrome being identical, the comparator 430 deems that the current syndrome matches the data at the check code position and, thus, determines that the last bit (i.e. the first data item) in the current candidate frame as received by the first XOR 421 in step 601 is a frame boundary of an Ethernet FEC layer.

After step 609, the flow then ends.

Figure 7:
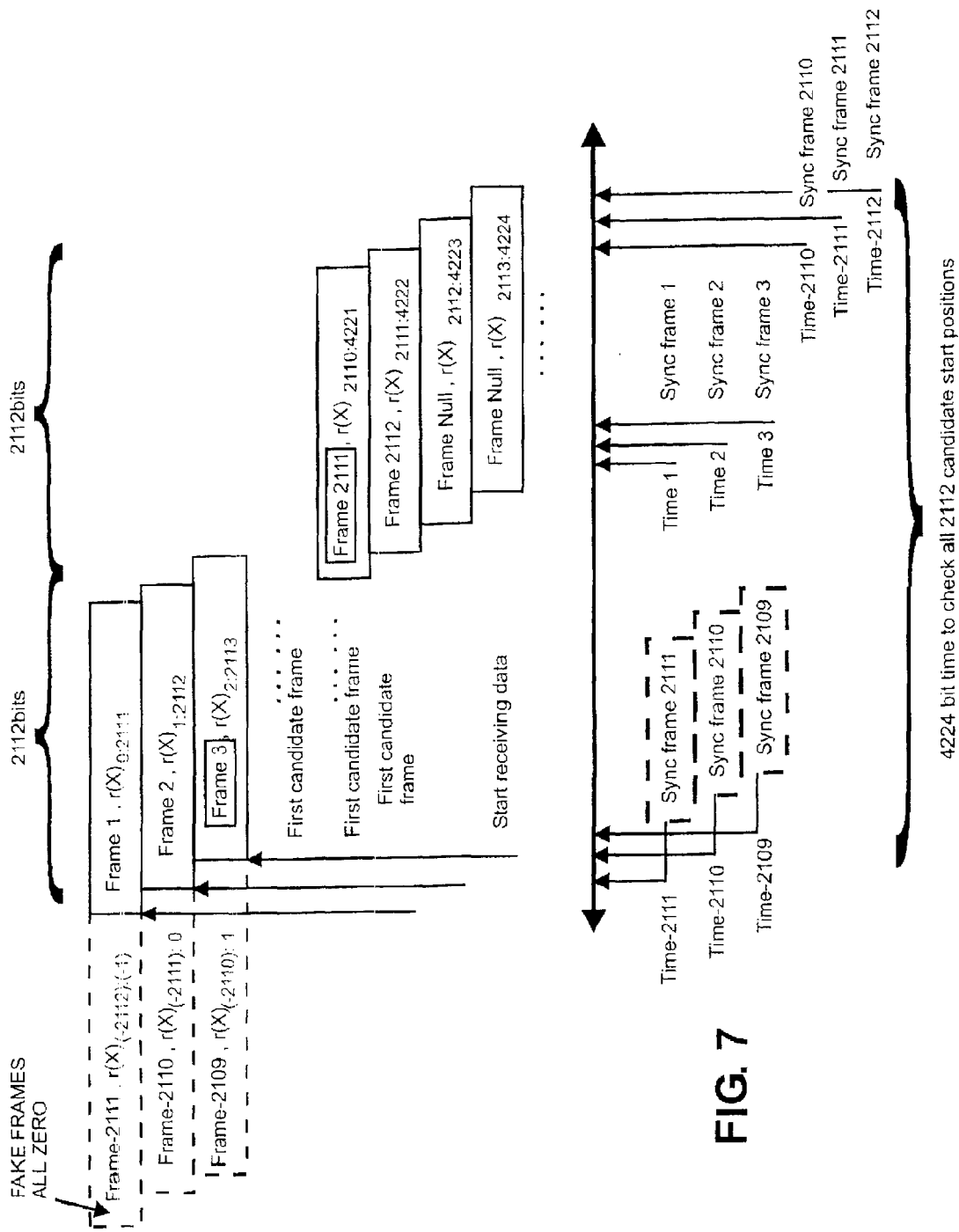
FIG. 7 is a schematic view illustrating how an apparatus for detecting frame boundary performs frame synchronization according to one embodiment of the present invention.

FIG. 7 illustrates a schematic view illustrating how an apparatus for detecting the frame boundary performs frame synchronization according to one embodiment of the present invention.

It is assumed that a "fake" frame exists before a first candidate frame, the fake frame having 2112 bits of 0 that are not data in a data stream from the PMA layer.

As illustrated in FIG. 7, a syndrome of frame-2111 is obtained at time-2111. At this point, MODR$_{(-2112):(-1)}$ is zero of 32 bits. At time-2110, a syndrome Syndrome$_{(-2111):0}$ and MODR$_{0:2111}$ corresponding to frame-2110 can be obtained according to equations (1) and (2) of the present invention. However, this syndrome is a "fake" syndrome, because this "fake" syndrome corresponds to an assumptive "fake" frame.

Likewise, a syndrome Syndrome$_{0:2111}$ and MODR$_{0:2111}$ corresponding to frame 1 (i.e. first candidate frame) can be obtained at time 1. At this point, the syndrome is compared with data at the check code position in frame 1, whereby it is determined whether frame 1 is a frame of the Ethernet FEC layer.

At time 2, a syndrome Syndrome$_{1:2112}$ and MODR$_{1:2112}$ corresponding to frame 2 (i.e. second candidate frame) can be obtained. At this point, the syndrome is compared with data at the check code position in frame 2, whereby it is determined whether frame 2 is a frame of the Ethernet FEC layer.

In this way, Syndrome$_{2111:4222}$ and MODR$_{2111:4222}$ corresponding to frame 2112 can be obtained at time 2112. At this point, the syndrome is compared with data at the check code position in frame 2112, whereby it is determined whether frame 2112 is a frame of an Ethernet FEC layer.

In the worst case, a frame boundary can definitely be detected by performing frame boundary detection on 2112 consecutive candidate frames with a start position of each of 2112 consecutive bits. In other words, it takes at most 4224 BT (bit time) to detect a frame boundary by using the method of the present invention. Compared with 8,921,087 BT in the prior art, the method in embodiments of the present invention speeds up the frame boundary detection for a data stream received at an Ethernet FEC layer by about 2112 times, thereby greatly enhancing the processing efficiency of the FEC decoding system.

The flowcharts and block diagrams in the figures illustrate the systems and methods, as well as architecture, functions and operations executable by a computer program product according to various embodiments of the present invention. In this regard, each step in the flowcharts or block diagrams may represent a module, a program segment or a part of code that contains one or more executable instructions for performing specified logic functions. It should be noted that in some alternative implementations, functions indicated in steps may occur in an order differing from the order shown in the figures. For example, two steps shown consecutively may be performed in parallel substantially or in an inverse order, depending upon the functions involved.

The present invention can be embodied in full hardware, full software or a form comprising both hardware components and software components. In a preferred embodiment, the present invention is implemented as software, including, without limitation, firmware, resident software, micro-code, etc.

Moreover, the present invention may be implemented as a computer program product used by computers or accessible by computer-readable media that provides program code for use by or in connection with a computer or any instruction executing system. For the purpose of description, a computer-usable or computer-readable medium may be any tangible means that can contain, store, communicate, propagate or transport the program for use by, or in connection with, an instruction execution system, apparatus or device.

The medium may be an electric, magnetic, optical, electromagnetic, infrared or semiconductor system (apparatus or device) or propagation medium. Examples of the computer-readable medium would include the following: a semiconductor or solid storage device, a magnetic tape, a portable computer diskette, a random access memory (RAM), a read-only memory (ROM), a hard disk and an optical disk. Examples of the current optical disk include a compact disk read-only memory (CD-ROM), compact disk-read/write (CR-ROM) and DVD.

A data processing system adapted for storing or executing program code would include at least one processor that is coupled to a memory element directly or via a system bus. The memory element may include a local memory usable while actually executing the program code, a mass memory and a cache that provides temporary storage for at least one portion of program code so as to decrease the number of times for retrieving code from the mass memory during execution.

An Input/Output or I/O device (including, without limitation, a keyboard, a display, a pointing device, etc.) may be coupled to the system directly or via an intermediate I/O controller.

A network adapter may also be coupled to the system such that the data processing system can be coupled to other data processing systems, remote printers or storage devices via an intermediate private or public network. A modem, a cable modem and an Ethernet card are merely examples of a currently available network adapter.

It will be understood from the foregoing description that modifications and alterations may be made to the respective embodiments of the present invention without departing from the true spirit of the present invention. The description in the present specification is intended to be illustrative and not limiting. The scope of the present invention is limited by the appended claims only.

What is claimed is:

1. A method of detecting a frame boundary for a data stream received at an Ethernet Forward Error Correction (FEC) layer, the method comprising:
    calculating a current syndrome based on a first data item, a second data item, and an intermediate calculation result of a previous syndrome, wherein the first data item is the last bit in a current candidate frame, and the second data item is a bit preceding the current candidate frame; and
    using the current syndrome to check whether the bit preceding the current candidate frame is a frame boundary of the Ethernet FEC layer.

2. The method according to claim 1, wherein calculating a current syndrome comprises:
    receiving the first data item as a first input for calculating the current syndrome;
    obtaining a second input for calculating the current syndrome by receiving the second data item and performing a logical AND operation on the second data item and a first parameter;
    obtaining a third input for calculating the current syndrome by shifting a first output for calculating a previous syndrome by one bit leftward and performing a modulus operation thereon;
    obtaining a first output for calculating the current syndrome by performing an XOR operation on the first input, the second input, and the third input for calculating the current syndrome; and
    obtaining the current syndrome by performing a logical XOR operation on the first output for calculating the current syndrome and a second parameter.

3. The method according to claim 2, wherein the modulus operation uses the following polynomial:

$$g(x)=x^{32}+x^{23}+x^{21}+x^{11}+x^2+1.$$

4. The method according to claim 2, wherein the first parameter and the second parameter are preset fixed parameters.

5. The method according to claim 1, wherein using the current syndrome to check whether the bit preceding the current candidate frame is a frame boundary of the Ethernet FEC layer comprises:
    obtaining data at a check code position in the current candidate frame according to a frame format of the Ethernet FEC layer; and
    in response to the current syndrome matching the data at the check code position, determining that the bit preceding the current candidate frame is a frame boundary of the Ethernet FEC layer.

6. A decoding method for a data stream received at an Ethernet Forward Error Correction (FEC) layer, the method comprising:
    detecting a frame boundary of the data stream by using a method of detecting a frame boundary according to claim 1, and outputting a current syndrome;
    determining an error in a current frame based on the current syndrome and a check code in a current candidate frame;
    descrambling the current candidate frame; and
    performing forward error correction on the descrambled frame based on the determined error.

7. The method according to claim 6, further comprising:
    based on a result of frame boundary detection, determining whether to perform frame boundary detection or forward error correction.

8. The method according to claim 6, further comprising:
    reconstructing data on which forward error correction has been performed into a format adaptive for a Physical Coding Sublayer.

9. An apparatus for detecting a frame boundary for a data stream received at an Ethernet Forward Error Correction (FEC) layer, the apparatus comprising:
    a buffer configured to buffer data in a data stream, a length of the data in the buffer being greater than one frame;
    a syndrome generator configured to calculate a current syndrome based on a first data item, a second data item, and an intermediate calculation result of a previous syndrome, wherein the first data item is the Fast bit in a current candidate frame, and the second data item is a bit preceding the current candidate frame; and
    a comparator configured to use the current syndrome to check whether the bit preceding the current candidate frame is a frame boundary of the Ethernet FEC layer.

10. The apparatus according to claim 9, wherein the syndrome generator comprises:
    a register configured to store an intermediate calculation result of a syndrome;
    a shifter configured to shift a data item;
    a modulus unit configured to perform a mod operation on the data item;
    a logical AND arithmetic unit configured to perform a logical AND operation;
    a first XOR unit configured to perform an XOR operation on three data items; and
    a second XOR unit configured to perform an XOR operation on two data items,
    wherein the first XOR unit receives the first data item as a first input for calculating the current syndrome;
    wherein the logical AND arithmetic unit receives the second data item and performs a logical AND operation on the second data item and a first parameter, to obtain a second input for calculating the current syndrome;
    wherein the shifter shifts a first output for calculating a previous syndrome by one bit leftward and the modulus unit performs a mode operation thereon to obtain a third input for calculating the current syndrome;
    wherein the first XOR unit performs an XOR operation on the first input, the second input, and the third input for calculating the current syndrome to obtain a first output for calculating the current syndrome and save the first output of the first XOR unit in the register; and
    wherein the second XOR unit performs a logical XOR operation on the first output for calculating the current syndrome and a second parameter to obtain the current syndrome.

11. The apparatus according to claim 10, wherein the modulus unit uses the following polynomial for a mod operation:

$$g(x)=x^{32}+x^{23}+x^{21}+x^{11}+x^2+1.$$

12. The apparatus according to claim 10, wherein the first parameter and the second parameter are preset fixed parameters.

13. The apparatus according to claim 10, wherein the comparator comprises:
an acquirer configured to obtain data at a check code position in the current candidate frame according to a frame format of the Ethernet FEC layer; and
a deciding unit, in response to the current syndrome matching the data at the check code position, configured to determine that the bit preceding the current candidate frame is a frame boundary of the Ethernet FEC layer.

14. A decoding system for a data stream received at an Ethernet FEC layer, the system comprising:
an apparatus for detecting a frame boundary according to claim 9, configured to detect a frame boundary of the data stream and outputting a current syndrome;
an error diagnosing unit configured to determine an error in a current frame based on the current syndrome and a check code of the current frame;
a descrambler configured to descramble the current frame; and
an error corrector configured to perform forward error correction on the frame that has been descrambled by the descrambler, based on the error determined by the error diagnosing unit.

15. The system according to claim 14, further comprising:
a controller configured to determine, based on a result of frame boundary detection from the apparatus for detecting a frame boundary, whether to perform frame boundary detection or forward error correction.

16. The system according to claim 14, further comprising:
a reconstructor for reconstructing data on which forward error correction has been performed into a format adaptive for a Physical Coding Sublayer.

* * * * *